(12) United States Patent
Hirai

(10) Patent No.: US 7,518,242 B2
(45) Date of Patent: Apr. 14, 2009

(54) SEMICONDUCTOR TESTING DEVICE

(75) Inventor: Miho Hirai, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 211 days.

(21) Appl. No.: 10/995,467

(22) Filed: Nov. 24, 2004

(65) Prior Publication Data

US 2005/0116338 A1    Jun. 2, 2005

(30) Foreign Application Priority Data

Nov. 28, 2003   (JP) ............................. 2003-398419

(51) Int. Cl.
   *H01L 23/48*   (2006.01)
(52) U.S. Cl. ..................... 257/758; 257/736; 257/760; 257/774; 257/780; 257/E23.02
(58) Field of Classification Search ............... 257/734, 257/758, 736, 760, 774, 780, E23.02
   See application file for complete search history.

(56) References Cited

U.S. PATENT DOCUMENTS

| 4,180,772 | A  | * | 12/1979 | Buelow et al. ............... 714/743 |
| 5,847,466 | A  | * | 12/1998 | Ito et al. ..................... 257/775 |
| 6,022,791 | A  | * | 2/2000  | Cook et al. .................. 438/458 |
| 6,133,582 | A  | * | 10/2000 | Osann et al. .................. 257/48 |
| 6,303,977 | B1 | * | 10/2001 | Schroen et al. ............. 257/635 |
| 6,313,537 | B1 | * | 11/2001 | Lee et al. ..................... 257/758 |
| 6,853,067 | B1 | * | 2/2005  | Cohn et al. .................. 257/704 |
| 7,053,495 | B2 | * | 5/2006  | Tsuura ....................... 257/797 |
| 7,091,613 | B1 | * | 8/2006  | Long et al. .................. 257/758 |
| 2002/0043717 | A1 | * | 4/2002 | Ishida et al. ................ 257/723 |
| 2002/0180026 | A1 | * | 12/2002 | Liu et al. ..................... 257/692 |
| 2003/0162354 | A1 | * | 8/2003 | Hashimoto et al. .......... 438/257 |
| 2005/0121804 | A1 | * | 6/2005 | Kuo et al. .................... 257/781 |

FOREIGN PATENT DOCUMENTS

JP       2002-329742       11/2002

* cited by examiner

*Primary Examiner*—Zandra Smith
*Assistant Examiner*—Tsz K Chiu
(74) *Attorney, Agent, or Firm*—McGinn IP Law Group, PLLC

(57) ABSTRACT

A semiconductor device has a bonding pad configured to be bonded to a bonding member, a test pad configured to contact with a test probe at a test, and an internal circuit electrically connected to the bonding pad and the test pad. The bonding pad overlaps with the internal circuit in a direction vertical to a surface of a semiconductor chip. The test pad does not overlap with the internal circuit in the direction.

18 Claims, 8 Drawing Sheets

SEMICONDUCTOR TESTING DEVICE

BACKGROUND OF THE INVENTION

1. Field of the Invention

The present invention relates to a semiconductor device having a bonding pad. In particular, the present invention relates to a semiconductor device having a bonding pad and a test pad.

2. Description of the Related Art

For semiconductor chips, particularly for semiconductor chips which are required to have high reliability, tests of non-defective or defective chips are implemented to all the products in order to secure the reliability in recent years. Then, only the non-defective products are shipped. Such a test is generally carried out by using a "bonding pad" for connecting a peripheral region of a semiconductor chip with an external electrode. The bonding pad is electrically connected to the external electrode through a wire bonding, flip chip bonding and the like.

FIG. 1 is a cross-sectional view showing around a bonding pad of a conventional semiconductor chip having a multi-layer structure. A metal layer 31 is formed on a surface of the semiconductor chip. A cover layer 6 is formed to cover the metal layer 31. The cover layer 6 has an aperture through which the metal layer 31 is exposed. The metal layer 31 exposed in the aperture configures a bonding pad 10.

In addition, a metal layer 32 is provided below the metal layer 31 through an interlayer insulating layer. The metal layer 31 and the metal layer 32 are connected with a plurality of through holes 7 in order to prevent separation of the metal layer 31 at the testing time and the bonding time.

The metal layers 33, 34 and 35 are further formed under an area inner than the area where the bonding pad 10 is formed (in the left-side in FIG. 1). Thus, the semiconductor chip has a multi-layer structure. An internal circuit 4 such as an input/output circuit is formed by the metal layers and the like.

FIG. 2 shows a configuration around the bonding pad 10 more in detail. The bonding pad 10 is formed by the metal layer 31. At the bonding, an alloy layer 701 is formed on a bonding surface of a bonding ball 702. The bonding ball 702 is used for bonding the bonding pad 10 to a bonding wire material. When the bonding ball 702 is made of gold (Au) and the metal layer 31 is made of aluminum (Al), the alloy layer 701 is made of alloy of Au and Al in order to improve adhesion. In this case, aluminum contained in the metal layer 31 moves to the alloy layer 701 due to a high temperature process such as an annealing, which causes a void 703 to occur at the boundary between the alloy layer 701 and the metal layer 31 as shown in FIG. 2. The void 703 thus generated can cause deterioration of conjugate properties between the bonding ball 702 and the bonding pad 10.

In order to prevent the occurrence of the void 703, an Au layer 801 (or an Au layer and a barrier metal layer) can be formed on the surface of the metal layer 31 constituting the bonding pad 10, as shown in FIG. 3A. However, since the bonding pad 10 is used also for the testing as mentioned above, a test probe 802 is brought into contact with the Au layer 801 at the testing as shown in FIG. 3A. Here, the test probe 802 has needle-shape and is made of conductive material which is at least harder than Au. Therefore, gold scraped away from the Au layer 801 adheres to the needlepoint of the test probe 802 as shown in FIG. 3B. Thus, it is necessary to clean the needlepoint frequently to remove the attached gold, which reduces throughput. Moreover, the frequent cleaning abrades and thicken the needlepoint, which reduces life of the test probe 802. Furthermore, the AU adhered to the test probe 802 tends to reduce accuracy of the test.

Furthermore, even in the case when the Au layer 801 is provided, a stylus pressure of the test probe 802 at the measuring can cause a crack in the Au layer 801. In this case, aluminum of the metal layer 31 can move through the crack in the Au layer 801 and hence a void is generated. The void thus generated can cause deterioration of conjugate properties.

As described above, when the bonding pad 10 is shared in the bonding and in the testing, the test probe 802 is brought into contact with the bonding pad 10 as shown in FIG. 4A. In this case, the test probe 802 scratches the surface of the bonding pad 10 and hence the trace of the pad occurs. Moreover, when the test probe pressure is increased in order to ascertain the electric connection, not only the bonding pad 10 but also the plurality of through holes 7 formed below the metal layer 31 may be broken as shown in FIG. 4B. Therefore, according to the conventional technique as shown in FIG. 1, the internal circuit 4 can not be made under the bonding pad 10 in order to avoid the break of the internal circuit 4 at the time of the testing.

Also, the damage on the surface of the bonding pad 10 due to the contact of the test probe 802 deteriorates bonding strength of a wire bonding or a bump bonding which is formed in a packaging process. Particularly, in recent years, the pitch between the pads and the pad size decrease in accordance with the miniaturization of the semiconductor chip. For instance, a bonding pad 10 shown in FIG. 5 has the size of X=about 60 μm and Y=about 60 μm. The test probe can contact the bonding pad 10 in an area having the size of x=15-20 μm and y=30-50 μm as a contact area. When the area of the bonding pad 10 is sufficiently larger than the contact area, the bonding is secured by the other area than the contact area even if a bad connection occurs in the contact area. However, the area of the bonding pad 10 itself becomes small, the other area also becomes small. In this way, the miniaturizing of the bonding pad 10 causes insufficient bonding properties.

Moreover, as the pad size becomes small, the width of interconnection for electrically connecting the bonding pad 10 and the internal circuit becomes small. Since power supply ability is proportional to the width of the interconnection, the reduction of the width of the interconnection causes reduction of the power supply ability. In order to handle this problem, a bonding pad 10 may be formed with two metal layers which are connected with each other via through holes, and interconnections can be provided for both of the two metal layers in order to improve the power supply ability. However, such through holes can be destroyed due to the pressure of the test probe, which reduces the power supply ability of the lower metal layer.

As described above, according to the conventional technique, the head of the test probe is brought into contact with the bonding pad 10 in a wafer testing as the final of wafer processes, which results in the above-mentioned problems. That is to say, the bonding pad 10 being shared in the bonding and in the testing causes the above-mentioned problems.

Japanese Laid Open Patent Application (JP-P2002-329742) discloses a technique to solve these problems. According to this technique, a "test pad" is provided in addition to a "bonding pad" in order to prevent the occurrence of probe traces on the bonding pad at the time of the testing. That is, the bonding pad and the test pad are provided separately in order to improve the bonding properties of the bonding pad. In this case, however, it is necessary to reserve areas for both of the bonding pad and the test pad, which causes increase of the chip size and the cost.

SUMMARY OF THE INVENTION

It is therefore an object of the present invention to provide a semiconductor device which can reduce its chip size and improve reliability of connection between a bonding pad and a bonding member.

In an aspect of the present invention, a semiconductor device has: a bonding pad configured to be bonded to a bonding member; a test pad configured to contact with a test probe at a test; and an internal circuit electrically connected to the bonding pad and the test pad. The bonding pad overlaps with the internal circuit in a direction vertical to a surface of a semiconductor chip. The test pad does not overlap with the internal circuit in the direction vertical to the surface of the semiconductor chip.

It is preferable in the semiconductor device that the bonding pad and the test pad are formed on a peripheral region of the semiconductor chip. More preferably, the test pad is located between the bonding pad and an edge of the semiconductor chip.

The semiconductor device can further have a conductive layer which is formed below the bonding pad and is connected to the bonding pad via a through hole. Also, the semiconductor device can further have a conductive layer which is formed below the test pad and is connected to the test pad via a through hole.

Preferably, the semiconductor device further has multi-layer interconnections which are electrically connected to the bonding pad and the test pad. Here, the internal circuit mentioned above includes a part of the multi-layer interconnections.

In this case, the semiconductor device can further has a through hole which connects the multi-layer interconnections and is located under an area between the bonding pad and the test pad.

It is also preferable that at least one of the multi-layer interconnections is formed not to overlap with the bonding pad. The number of interconnections of the multi-layer interconnections located under the bonding pad is smaller than the number of the multi-layer interconnections.

In the semiconductor device above, the internal circuit may include a non-volatile memory.

In another aspect of the present invention, a semiconductor device has: a bonding pad configured to be bonded to a bonding member; a test pad configured to contact with a test probe at a test; and an internal circuit electrically connected to the bonding pad and the test pad. The internal circuit includes: a first internal circuit which overlaps with the bonding pad in a direction vertical to a surface of a semiconductor chip; and a second internal circuit which overlaps with the test pad in the direction vertical to the surface of the semiconductor chip. A distance between the test pad and the second internal circuit is larger than a distance between the bonding pad and the first internal circuit.

It is preferable in the semiconductor device that the bonding pad and the test pad are formed on a peripheral region of the semiconductor chip. More preferably, the test pad is located between the bonding pad and an edge of the semiconductor chip.

Preferably, the semiconductor device further has multi-layer interconnections which are electrically connected to the bonding pad and the test pad. Here, the internal circuit mentioned above includes a part of the multi-layer interconnections.

In this case, the semiconductor device can further have a through hole which connects the multi-layer interconnections and is located under an area between the bonding pad and the test pad. It is also preferable that at least one of the multi-layer interconnections is formed not to overlap with the bonding pad.

According to the semiconductor device of the present invention, the size of the semiconductor chip can be reduced and the reliability of connection between the bonding pad and the bonding member can be improved. More specifically, since the test pad is provided separately from the bonding pad, damage of the bonding pad due to a test probe is prevented. Thus, the bonding properties between the bonding pad and the bonding member is improved. Here, the internal circuit is provided under the bonding pad, namely, the bonding pad is formed to overlap with the internal circuit. Therefore, the size of the semiconductor chip can be reduced. On the other hand, the test pad is formed not to overlap with the internal circuit. Or, the internal circuit is provided also under the test pad sufficiently away from each other. This can prevent the internal circuit from being destroyed at the time of test. In particular, the present invention is effective for a semiconductor device in which the test by using a test probe is carried out for more than two times.

DESCRIPTION OF THE PREFERRED EMBODIMENTS

Embodiments of the present invention will be described below with reference to the attached drawings.

First Embodiment

Figure 1:
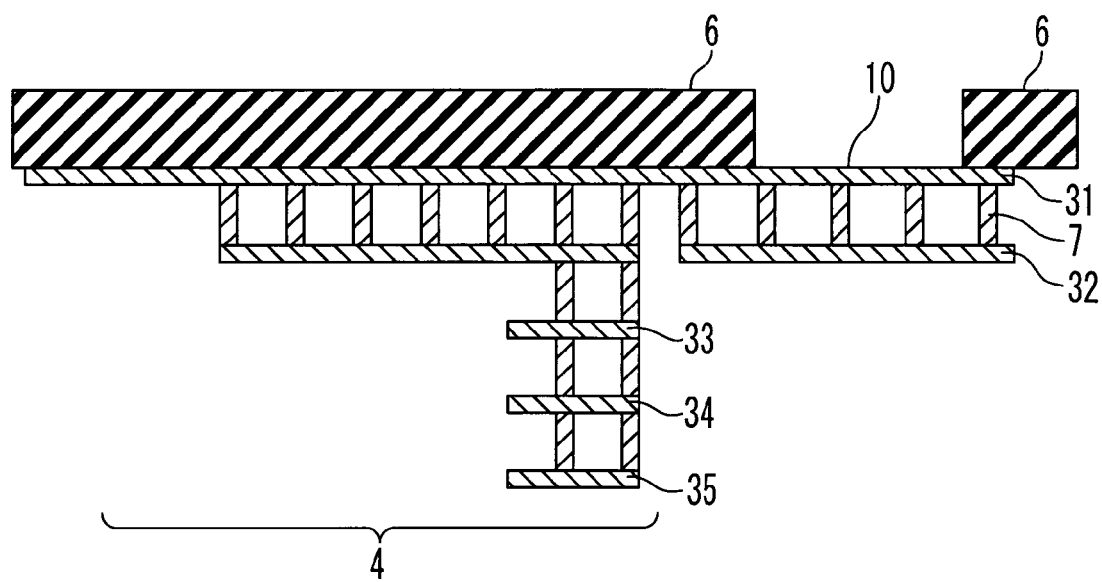
FIG. 1 is a cross sectional view showing a conventional semiconductor device.
Figure 2:
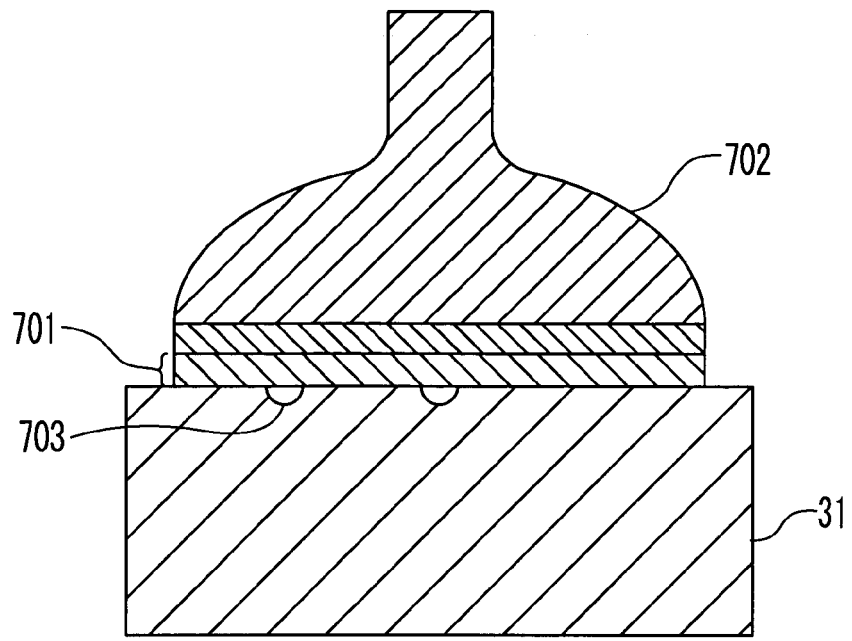
FIG. 2 is a cross sectional view showing around a bonding pad of the conventional semiconductor device.
Figure 3A:
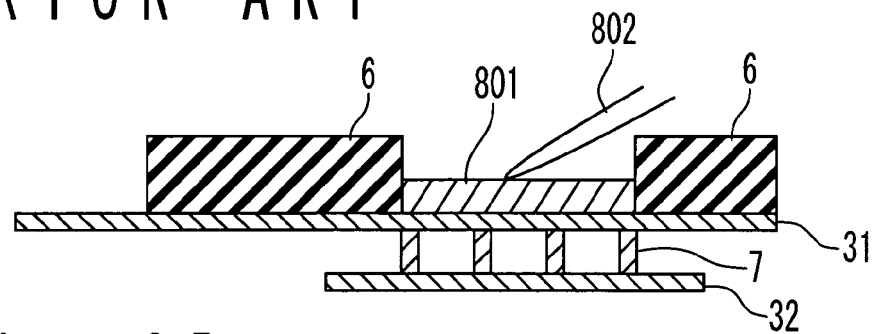
FIG. 3A is a cross sectional view showing another conventional semiconductor device.
Figure 3B:
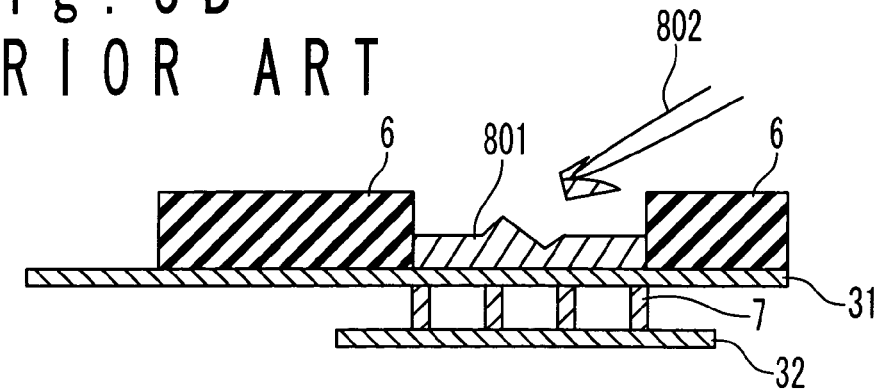
FIG. 3B is a cross sectional view showing the other conventional semiconductor device.
Figure 4A:
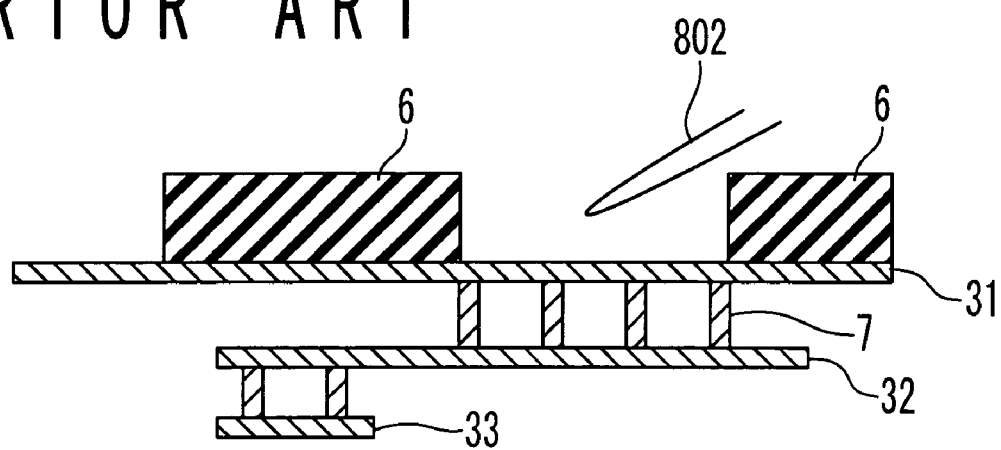
FIG. 4A is a cross sectional view showing still another conventional semiconductor device.
Figure 4B:
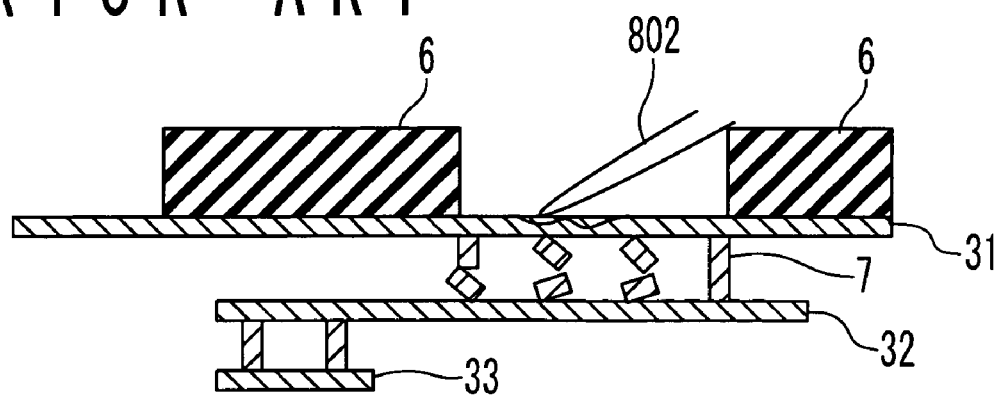
FIG. 4B is a cross sectional view showing the other conventional semiconductor device.
Figure 5:
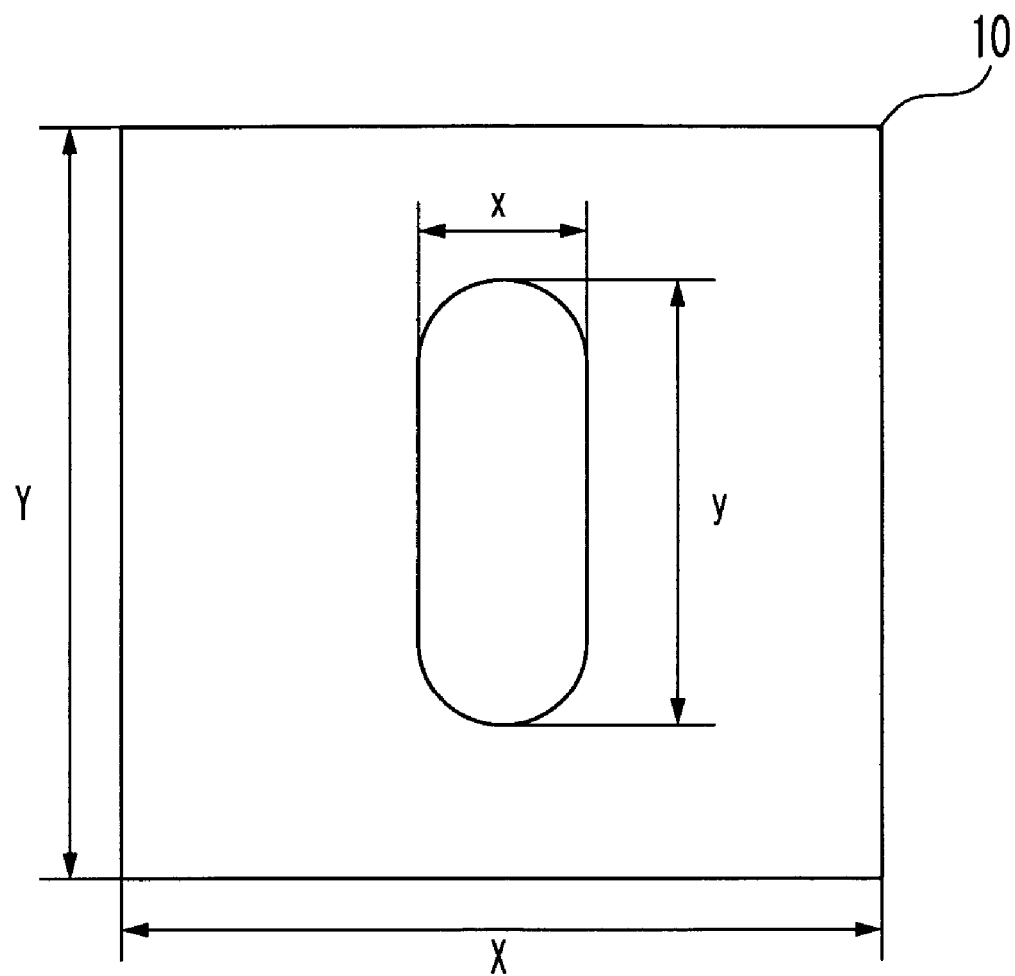
FIG. 5 is a top view showing a conventional semiconductor device.
Figure 6:
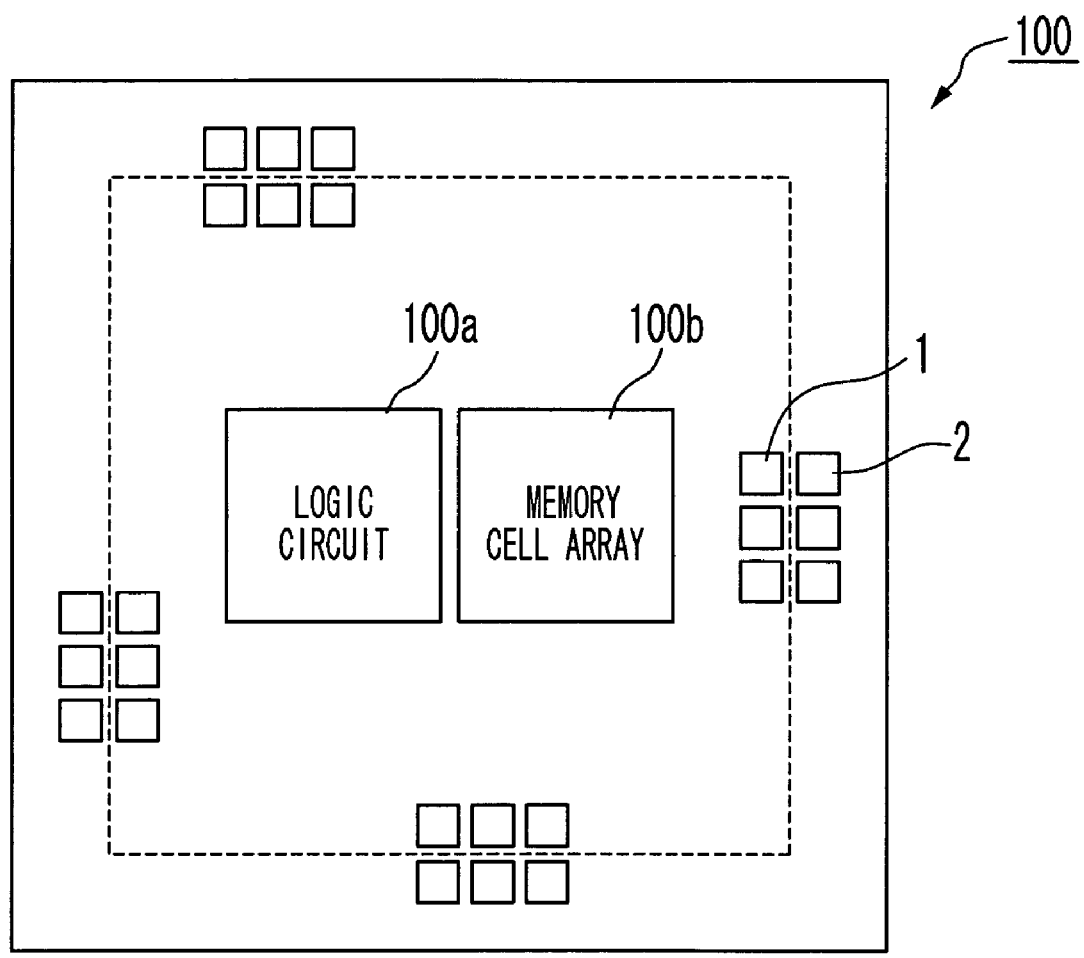
FIG. 6 is a top view showing a semiconductor device according to a first embodiment of the present invention.

FIG. 6 is a top view showing a semiconductor chip 100 of a semiconductor device according to the first embodiment of the present invention. As shown in FIG. 6, the semiconductor device has a plurality of bonding pads 1 and a plurality of test pads 2. The "bonding pad 1" is used for a bonding and is configured to be bonded to a bonding member. The "test pad 2" is used for a testing and is configured to contact with a test probe at the testing. The plurality of test pads 2 are provided for respective of the plurality of bonding pads 1. As shown in FIG. 6, the plurality of bonding pads 1 and the plurality of test pads 2 are formed on a peripheral region of the semiconductor chip 100. Here, on the semiconductor chip 100, a region where the plurality of test pads 2 are formed is outer than a region where the plurality of bonding pads 1 are formed. That is to say, each test pad 2 is located between corresponding one bonding pad 1 and an edge of the semiconductor chip 100.

Also, the semiconductor device has a logic circuit 100*a* and a memory cell array 100*b*. It should be noted that description of interconnections which connect with the pads, the logic circuit 100*a* and the memory cell array 100*b* is omitted in FIG. 6. Also, an input/output circuit (an I/O circuit, an input protection circuit and the like) is provided near the bonding pad 1.

In the present specification, an "internal circuit" is defined as a circuit including the logic circuit 100*a*, the memory cell array 100*b* and the input/output circuit. The internal circuit is electrically connected to the bonding pad 1 and the test pad 2. The internal circuit operates when the semiconductor device becomes a product. In other words, the internal circuit does not include a circuit or a pattern which operates and is used only when manufacturing the semiconductor device. For example, the internal circuit does not include an alignment reference marks used only for positioning at the manufacturing and a pattern used only for a test of properties. The internal circuit is configured by interconnections (multi-layer interconnections) and/or devices formed in active device region.

Preferably, the memory cell array 100*b* includes a non-volatile memory such as an EEPROM, an EPROM and the like. In general, it is necessary in the non-volatile memory to execute not only a logic test but also another test independently. Therefore, the number of testing increases, which can cause enhancement of damages of the test pad 2. Thus, it is particularly effective to apply the present invention to such a non-volatile memory. For example, as for the semiconductor chip 100 including the logic circuit 100*a* and the memory cell array 100*b* as shown in FIG. 6, at least two kinds of tests should be carried out for respective of the logic circuit 100*a* and the memory cell array 100*b*. Since the test targets are different, it is necessary to execute the tests by using different apparatuses. A test probe should be brought into contact with the test pad 2 for every test, which causes the increase of the damages of the test pad 2. Furthermore, in a case of a semiconductor chip 100 such as an on-vehicle semiconductor chip for which the high reliability is required, at least four kinds of tests should be carried out. That is to say, a low temperature test, a normal temperature test, and a high temperature test for the logic circuit 100*a* in addition to a test for the memory cell array 100*b* should be carried out. If the test result turns out to be fault, these four kinds of tests are repeated. Depending on the target chip, the tests may be carried out for eight (4*2) times, twelve (4*3) times and more. Also, when a measurement error occurs, the same test is executed with higher contact pressure of the test probe. This can increase the chance of damaging the test pad 2.

As described above, in a semiconductor chip 100 for which a plurality number of tests should be carried out, the damage of the test pad 2 increases. According to the present invention, however, the plurality of test pads 2 dedicated to testing the semiconductor device are provided for the semiconductor chip 100 as shown in FIG. 6. Thus, the plurality of bonding pads 1 do not receive damages. Therefore, the bonding properties between the bonding pad 1 and the bonding member is improved.

Figure 7A:
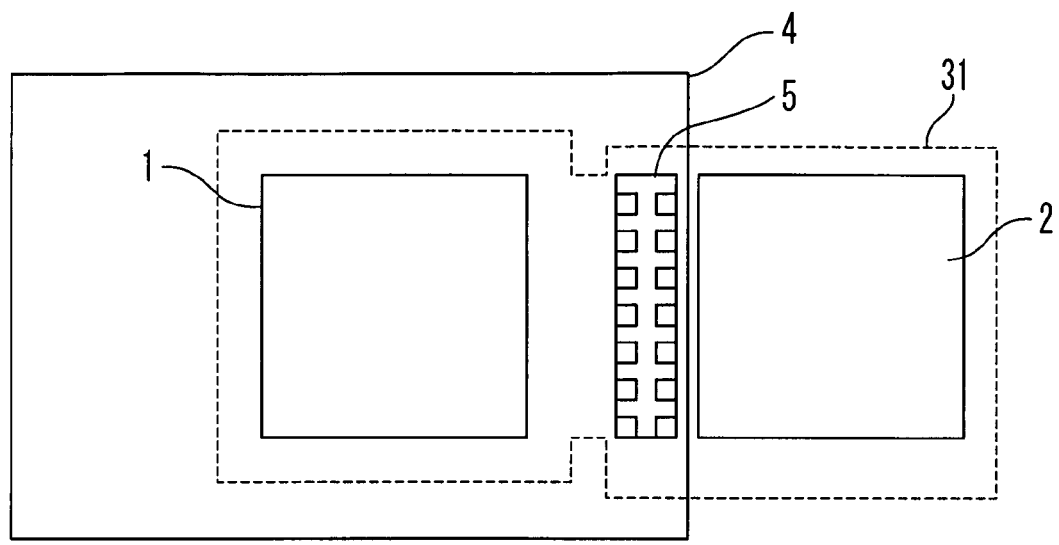
FIG. 7A is a magnified top view showing the semiconductor device according to the first embodiment.
Figure 7B:
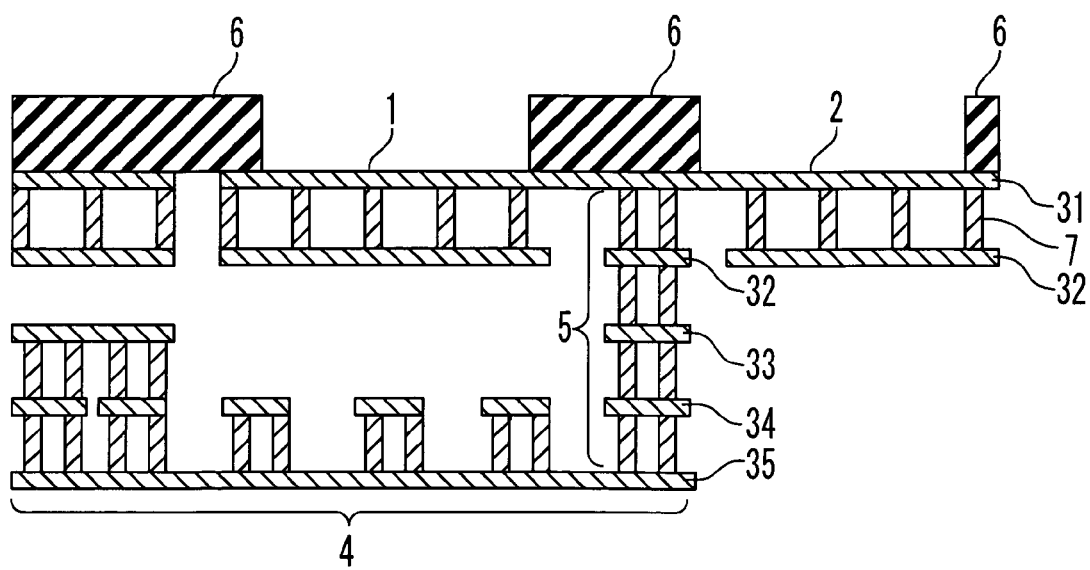
FIG. 7B is a cross sectional view showing the semiconductor device according to the first embodiment.

FIGS. 7A and 7B are a magnified top view and a cross sectional view showing around the bonding pad 1 and the test pad 2 of the semiconductor device according to the present embodiment, respectively. In FIG. 7B, description of interlayer insulating film and the like is omitted for simplicity.

As shown in FIG. 7B, the semiconductor device in the present embodiment has a multi-layer structure. That is, the semiconductor device has multi-layer metal interconnections (31, 32, 33, 34, and 35) which are electrically connected to the bonding pad 1 and the test pad 2. Each of the multi-layer metal interconnections is formed on an interlayer insulating film which is planarized by the CMP (Chemical Mechanical Polishing). The number of the layers may be four to six or more.

The top layer of the semiconductor chip 100 is a metal layer 31. The metal layer 31 is made of aluminum (Al) or a copper (Cu), for example. The metal layer 31 is covered by a cover layer 6. The cover layer 6 is made of polyimide for example, and is also called a coat layer or a surface protecting layer. The cover layer 6 has an aperture in which a part of the metal layer 31 is exposed. The bonding pad 1 is formed as the exposed part of the metal layer 31. The bonding pad 1 has a square shape, for example, 50 to 80 μm on a side. The bonding pad 1 is to be connected to an external electrode through a wire bonding, a ball bonding and the like.

Figure 8:
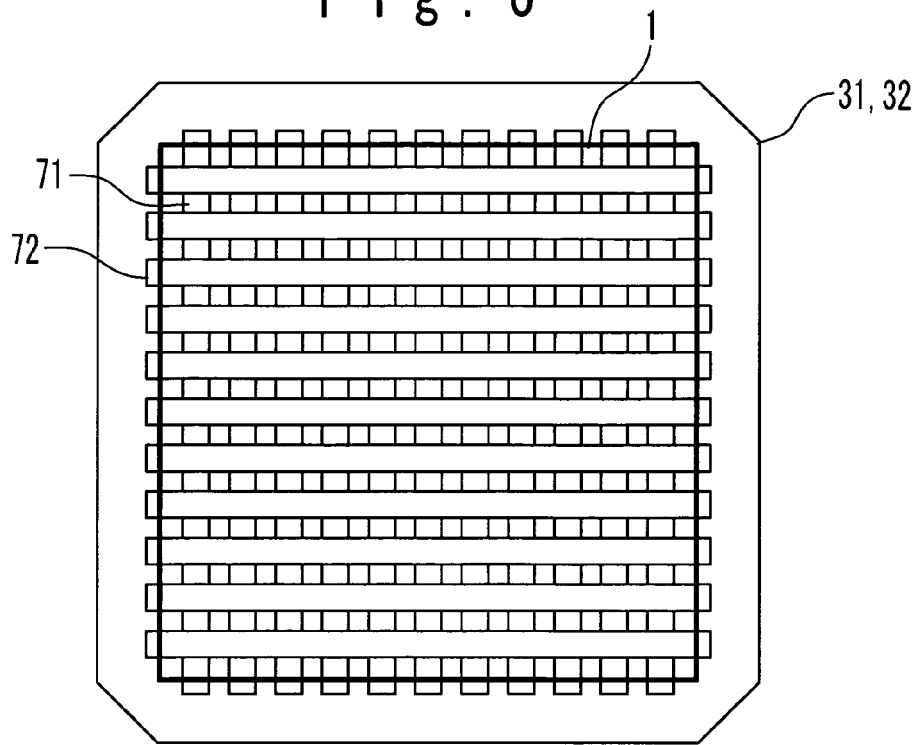
FIG. 8 is a top view showing a bonding pad of the semiconductor device according to the first embodiment.

A metal layer (conductive layer) 32 is formed below the bonding pad 1. The metal layer 32 is connected to the metal layer 31 (the bonding pad 1) via a plurality of through holes 7. Such a configuration can prevent the metal layer 31 in the area where the bonding pad 1 is formed from peeling off at the bonding. FIG. 8 shows a configuration of the plurality of through holes 7. The plurality of through holes 7 are formed by wall-like vias 71 and 72 which are orthogonal to each other. Thus, as shown in FIG. 8, the plurality of through holes 7 are formed in a reticular pattern when viewed from the top side. Such a configuration can prevent the peeling off of the metal layer 31 more effectively. In an example shown in FIG. 7B, the metal layer 31 is divided at the inner part (left side) of the bonding pad 1. However, the metal layer 31 can be connected at that point. Also, the metal layer 32 is divided at some points in FIG. 7B. However, the metal layer 32 can be connected at those points. In particular, it is preferable that the metal layer 32 in a through hole region 5 is connected to adjacent metal layer 32. In this case, it becomes possible to reduce a resistance of the interconnection and hence electric current loss.

The semiconductor device according to the present invention has an internal circuit 4 which is electrically connected to the bonding pad 1 and the test pad 2. The internal circuit 4 includes a part of the multi-layer interconnections (metal layers 34 and 35, for example). The internal circuit 4 is, for example, an input/output circuit.

According to the present embodiment, the internal circuit 4 is provided under the bonding pad 1 as shown in FIGS. 7A and 7B. In other words, the bonding pad 1 overlaps with the internal circuit 4 in a direction vertical to a surface of the semiconductor chip 100 as shown in FIGS. 7A and 7B. Since the bonding pad 1 is formed over the internal circuit 4, it is possible to prevent increase of the chip size and to reduce the chip size.

Also, in the example shown in FIG. 7B, a metal layer 33 (the second layer of the multi-layer interconnections) is not located under the bonding pad 1. A thick interlayer insulating film is formed between the metal layer 32 and a metal layer 34 (the third layer of the multi-layer interconnections) under the bonding pad 1. Thus, according to the present embodiment, at least one of the multi-layer interconnections is formed not to overlap with the bonding pad 1. The number of metal layers (interconnections) located under the bonding pad 1 is smaller than the total number of the multi metal layers. Such a configuration can reduce the pressure against the internal circuit 4 formed under the bonding pad 1 at the time of the bonding. Therefore, the possibility that the internal circuit 4 is destroyed at the bonding can be reduced.

As shown in FIGS. 7A and 7B, the metal layer 31 is formed to extend from the region where the bonding pad 1 is formed to the outer region (right side in FIGS. 7A and 7B). The cover layer 6 has another aperture in which a part of the metal layer 31 is exposed. The other aperture is located between the bonding pad 1 and the edge of the semiconductor chip 100 (see FIG. 6). The test pad 2 is formed as the other exposed part of the metal layer 31. The test pad 2 is to be brought into contact with a test probe at a testing. The test pad 2 may have substantially the same shape as the bonding pad 1. The test pad 2 can have a different shape from the bonding pad 1.

Figure 9:
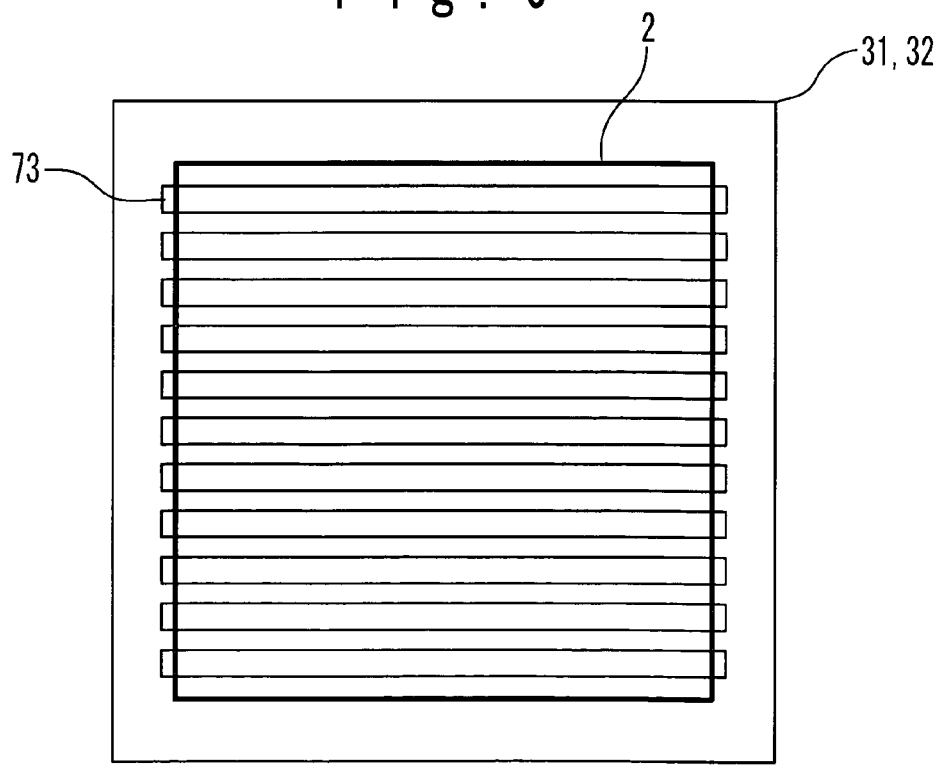
FIG. 9 is a top view showing a test pad of the semiconductor device according to the first embodiment.

The metal layer (conductive layer) 32 is also formed below the test pad 2 as shown in FIG. 7B. The metal layer 32 is connected to the metal layer 31 (the test pad 2) via a plurality of through holes 7. Such a configuration can prevent the metal layer 31 in the area where the test pad 2 is formed from peeling off at the testing. FIG. 9 shows a configuration of the plurality of through holes 7. The plurality of through holes 7 are formed by wall-like vias 73 which are parallel to each other. Such a configuration can prevent the peeling off of the metal layer 31 more effectively. It should be noted that an interlayer insulating film is formed below the test pad 2. Preferably, the interlayer insulating film is planarized by the CMP.

According to the present embodiment, the internal circuit 4 is not provided under the test pad 2 as shown in FIGS. 7A and 7B. In other words, the test pad 2 does not overlap with the internal circuit 4 in the direction vertical to the surface of the semiconductor chip 100 as shown in FIGS. 7A and 7B. This configuration can prevent the internal circuit 4 from being destroyed when a test probe is pressed against the test pad 2 at the time of the testing.

Also, there is a through hole region 5 under an area between the bonding pad 1 and the test pad 2, as shown in FIG. 7B. The through hole region 5 includes a plurality of through holes 7 which connect the metal layers (multi-layer interconnections) 31, 32, 33, 34 and 35 one after another. In the through hole region 5, the plurality of through holes 7 are provided from the top layer to the bottom layer to penetrate the multi metal layers and multi interlayer insulating films. The internal circuit 4 is connected to the bonding pad 1 and the test pad 2 through the through hole region 5.

As described above, in the semiconductor device according to the first embodiment of the present invention, the test pad 2 is provided separately from the bonding pad 1. Therefore, damage of the bonding pad 1 due to the test probe is prevented. Thus, the bonding properties between the bonding pad 1 and the bonding member (bonding wire, bonding ball and so on) is improved. Here, the internal circuit 4 is provided under the bonding pad 1, namely, the bonding pad 1 is formed to overlap with the internal circuit 4. Therefore, the size of the semiconductor chip 100 can be reduced. On the other hand, the test pad 2 is formed not to overlap with the internal circuit 4. This can prevent the internal circuit 4 from being destroyed at the time of the testing.

Second Embodiment

A semiconductor device according to the second embodiment is different from that of the first embodiment in that the internal circuit 4 is formed not only under the bonding pad 1 but also under the test pad 2. That is to say, the test pad 2 is also formed to overlap with the internal circuit 4. Here, the internal circuit 4 under the test pad 2 is provided sufficiently away from the test pad 2. More specifically, the internal circuit 4 formed under the test pad 2 is located lower than the internal circuit 4 formed under the bonding pad 1. The detailed configuration will be described below in detail.

As in the first embodiment, the bonding pad 1 and the test pad 2 in the present embodiment are formed on the peripheral region of the semiconductor chip 100 (see FIG. 6). Moreover, the test pad 2 is located between the bonding pad 1 and an edge of the semiconductor chip 100.

Figure 10:
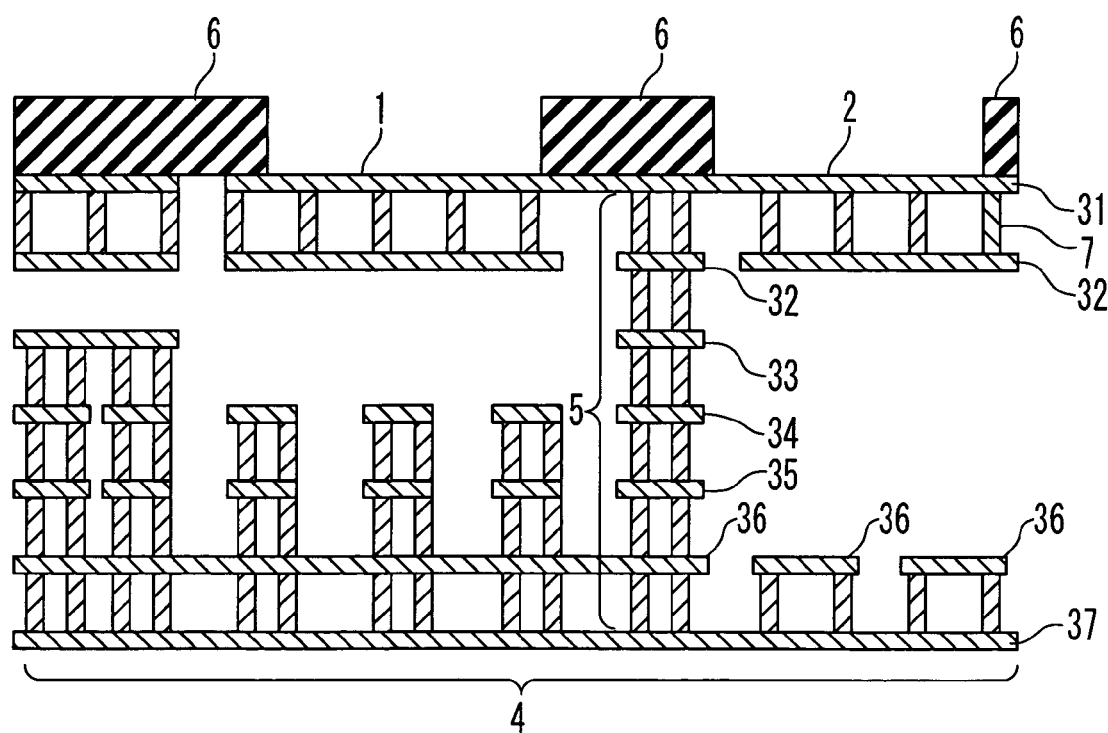
FIG. 10 is a cross sectional view showing a semiconductor device according to a second embodiment of the present invention.

FIG. 10 is a cross sectional view showing around the bonding pad 1 and the test pad 2 of the semiconductor device according to the present embodiment. Explanation of similar structures as in the first embodiment will be omitted.

As shown in FIG. 10, the semiconductor device has a multi-layer structure. That is, the semiconductor device has multi-layer metal interconnections (seven metal layers 31 to 37) which are electrically connected to the bonding pad 1 and the test pad 2. The top layer is the metal layer 31 where the bonding pad 1 and the test pad 2 are formed. The metal layer (conductive layer) 32 is formed below the bonding pad 1 and the test pad 2. The metal layer 32 is connected to the metal layer 31 (the bonding pad 1 and the test pad 2) via the plurality of through holes 7. Such a configuration can prevent the metal layer 31 from peeling off at the bonding and the testing. Also, as is in the first embodiment, at least one of the multi-layer metal interconnections is formed not to overlap with the bonding pad 1. Such a configuration can reduce the possibility that the internal circuit 4 is destroyed at the bonding.

According to the present embodiment, the internal circuit 4 can be classified into a first internal circuit and a second internal circuit. The first internal circuit is located under the bonding pad 1 and includes the metal layers 34, 35, 36 and 37 as shown in FIG. 10. On the other hand, the second internal circuit is located under the test pad 2 and includes the metal layers 36 and 37. That is, the first internal circuit overlaps with the bonding pad 1 in the vertical direction, and the second internal circuit overlaps with the test pad 2 in the vertical direction.

Also, the second internal circuit is located lower than the first internal circuit. More specifically, the top layer of the second internal circuit (the metal layer 36) is located lower than the top layer of the first internal circuit (the metal layer 34). In other words, a distance from the test pad 2 to the uppermost layer of the internal circuit 4 is longer than a distance from the bonding pad 1 to the uppermost layer of the internal circuit 4. Thus, the first internal circuit is provided apart from the bonding pad 1 to the extent that the first internal circuit is not destroyed by the bonding. The second internal circuit is provided apart from the test pad 2 to the extent that the second internal circuit is not destroyed by the testing. Usually, impact of the testing on the internal circuit 4 is larger than that of the bonding on the internal circuit 4. Therefore, the distance between the test pad 2 and the internal circuit 4 is larger than that between the bonding pad 1 and the internal circuit 4.

As described above, in the semiconductor device according to the second embodiment of the present invention, the test pad 2 is provided separately from the bonding pad 1. Therefore, damage of the bonding pad 1 due to the test probe is prevented. Thus, the bonding properties between the bonding pad 1 and the bonding member (bonding wire, bonding ball and so on) is improved. Here, the internal circuit 4 is provided under both the bonding pad 1 and the test pad 2. Therefore, the size of the semiconductor chip 100 can be reduced. Moreover, the distance between the test pad 2 and the internal circuit 4 is larger than that between the bonding pad 1 and the internal circuit 4, which can prevent the internal circuit 4 from being destroyed at the time of the testing.

Other Embodiments

In the embodiments above, the bonding pad 1 and the test pad 2 are provided in the peripheral region of the semiconductor chip 100. However, it is not be limited to this configuration. The bonding pad 1 and the test pad 2 can be provided near the center of the semiconductor chips 100, or can be provided over the whole area of the semiconductor chip 100.

Moreover, the metal layers as the multi-layer interconnections in the above-mentioned embodiments can be substituted with conductive layers.

The present invention is particularly effective when more than two tests are necessary. As mentioned above, it is necessary in a non-volatile memory to carry out different tests. Therefore, it is preferable to apply the present invention to a semiconductor chip having a non-volatile memory.

It will be obvious to one skilled in the art that the present invention may be practiced in other embodiments that depart from the above-described specific details. The scope of the present invention, therefore, should be determined by the following claims.

What is claimed is:

1. A semiconductor device comprising:
a bonding pad coupled to an external electrode;
a test pad configured to contact with a test probe at a test; and
an internal circuit electrically connected to said bonding pad and said test pad,
wherein said bonding pad overlaps with said internal circuit in a direction vertical to a surface of a semiconductor chip, and said test pad does not overlap with said internal circuit in said direction,
wherein said bonding pad and said test pad are formed on a peripheral region of said semiconductor chip, and
wherein said test pad is located between said bonding pad and a nearest edge of said semiconductor chip.

2. A semiconductor device comprising:
a bonding pad configured to be bonded to a bonding member;
a test pad configured to contact with a test probe at a test;
a cover layer having separate apertures through which said bonding pad and said test pad are exposed, respectively; and
an internal circuit electrically connected to said bonding pad and said test pad,
wherein said bonding pad overlaps with said internal circuit in a direction vertical to a surface of a semiconductor chip, and said test pad does not overlap with said internal circuit in said direction,
wherein said bonding pad and said test pad are formed on a peripheral region of said semiconductor chip, and
wherein said test pad is located between said bonding pad and a nearest edge of said semiconductor chip.

3. The semiconductor device according to claim 1, wherein said internal circuit is internal to said semiconductor chip.

4. The semiconductor device according to claim 1, further comprising a conductive layer formed below said bonding pad and connected to said bonding pad via a through hole.

5. The semiconductor device according to claim 1, further comprising a conductive layer formed below said test pad and connected to said test pad via a through hole.

6. The semiconductor device according to claim 1, further comprising multi-layer interconnections electrically connected to said bonding pad and said test pad,
wherein said internal circuit includes a part of said multi-layer interconnections.

7. The semiconductor device according to claim 6, further comprising a through hole connecting said multi-layer interconnections and located under an area between said bonding pad and said test pad.

8. The semiconductor device according to claim 6, wherein at least one of said multi-layer interconnections is formed not to overlap with said bonding pad.

9. The semiconductor device according to claim 6, wherein a number of interconnections of said multi-layer interconnections located under said bonding pad is smaller than a number of said multi-layer interconnections.

10. The semiconductor device according to claim 4, through hole is formed in a reticular pattern.

11. The semiconductor device according to claim 5, wherein said through hole has a wall shape.

12. The semiconductor device according to claim 1, wherein said internal circuit includes a non-volatile memory.

13. A semiconductor device comprising:
a bonding pad coupled to an external electrode;
a test pad configured to contact with a test probe at a test; and
an internal circuit electrically connected to said bonding pad and said test pad,
wherein said internal circuit includes:
a first internal circuit which overlaps with said bonding pad in a direction vertical to a surface of a semiconductor chip; and
a second internal circuit which overlaps with said test pad in said direction,
wherein a distance between said test pad and said second internal circuit is larger than a distance between said bonding pad and said first internal circuit,
said bonding pad and said test pad are formed on a peripheral region of said semiconductor chip, and
said test pad is located between said bonding pad and a nearest edge of said semiconductor chip.

14. The semiconductor device according to claim 13, further comprising a cover layer having separate apertures through which said bonding pad and said test pad are exposed, respectively.

15. The semiconductor device according to claim 13, wherein said internal circuit is internal to said semiconductor chip.

16. The semiconductor device according to claim 13, further comprising multi-layer interconnections electrically connected to said bonding pad and said test pad,
wherein said internal circuit includes a part of said multi-layer interconnections.

17. The semiconductor device according to claim 16, further comprising a through hole connecting said multi-layer interconnections and located under an area between said bonding pad and said test pad.

18. The semiconductor device according to claim 16, wherein at least one of said multi-layer interconnections is formed not to overlap with said bonding pad.

* * * * *